US011205220B2

(12) United States Patent
Sampson et al.

(10) Patent No.: US 11,205,220 B2
(45) Date of Patent: Dec. 21, 2021

(54) SYSTEM AND METHOD FOR VISUAL TRACEABILITY OF REQUIREMENTS FOR PRODUCTS

(71) Applicant: Siemens Industry Software Inc., Plano, TX (US)

(72) Inventors: Mark Sampson, Hurricane, UT (US); Burthal Corbin, Loveland, OH (US); Damodar Bhandarkar, Dallas, TX (US)

(73) Assignee: Siemens Industry Software Inc., Plano, TX (US)

( * ) Notice: Subject to any disclaimer, the term of this patent is extended or adjusted under 35 U.S.C. 154(b) by 184 days.

(21) Appl. No.: 16/467,887

(22) PCT Filed: Feb. 28, 2017

(86) PCT No.: PCT/US2017/019884
§ 371 (c)(1),
(2) Date: Jun. 7, 2019

(87) PCT Pub. No.: WO2018/160162
PCT Pub. Date: Sep. 7, 2018

(65) Prior Publication Data
US 2019/0370889 A1    Dec. 5, 2019

(51) Int. Cl.
*G06Q 30/06* (2012.01)
*G06F 9/451* (2018.01)

(52) U.S. Cl.
CPC ......... *G06Q 30/0643* (2013.01); *G06F 9/451* (2018.02)

(58) Field of Classification Search
CPC .... G06F 3/04815; G06F 3/0484; G06F 9/451; G06Q 30/0643
See application file for complete search history.

(56) References Cited

U.S. PATENT DOCUMENTS 6,232,984 B1 *   5/2001   Chuah .................... G06Q 10/10
                                                                      345/440
8,589,858 B1 *  11/2013   Watson ..................... G06F 8/74
                                                                      717/100
(Continued)

OTHER PUBLICATIONS

Ozkaya et al., "Tool support for computer-aided requirement traceability in architectural design: The case of DesignTrack", Automation in Construction, Elsevier, Amsterdam, NL, vol. 16, No. 5, Apr. 17, 2007, pp. 674-684.
(Continued)

*Primary Examiner* — Eric J. Bycer

(57) ABSTRACT

A system and method is provided for visual traceability of requirements for products. The system may include a processor configured to generate a user interface through a display device that outputs a listing of at least a portion of a plurality of requirements for a product based on data stored in a data store that specifies associations between requirements and one or more of a plurality of components included in the product. The processor may receive a first input through at least one input device that is representative of a first selection of at least one of the plurality of requirements. Responsive to the first selection, the processor may determine at least one component that is associated in the data store with the at least one requirement for the product that was selected via the first input and cause the user interface to visually indicate in a three dimensional (3D) visualization of a 3D model of the product, which of the plurality of components shown in the 3D visualization of the 3D model of the product are associated with the at least one requirement that was selected via the first input.

20 Claims, 5 Drawing Sheets

(56) References Cited

U.S. PATENT DOCUMENTS

| | | | |
|---|---|---|---|
| 2008/0034327 A1* | 2/2008 | Cisler | G06F 9/451 715/854 |
| 2012/0143570 A1* | 6/2012 | Austin | G06Q 10/00 703/1 |
| 2013/0080140 A1* | 3/2013 | Behr | G06F 11/3604 703/21 |
| 2015/0034327 A1* | 2/2015 | Ahn | E21B 33/064 166/367 |
| 2015/0339282 A1* | 11/2015 | Goyal | H04N 5/262 715/229 |
| 2017/0185574 A1* | 6/2017 | Fern | G06F 3/04842 |
| 2017/0228393 A1* | 8/2017 | Fay | G06F 16/93 |
| 2017/0351244 A1* | 12/2017 | Wolf | G05B 19/4063 |

OTHER PUBLICATIONS

Anonymous, Simulink Verification and Validation(TM) User's Guide, Mar. 1, 2015, Retrieved from the Internet: URL:http://files.matlabsite.com/docs/books/matlab-docs/simulink_verifiation_and_validation_slvnv_ug_r2015a.pdf [retrieved on Oct. 10, 2017].

"Information technology—System and software engineering—Guide for requirements engineering tool capabilities", ISO/IEC TR 24766:2009, IEC, 3, Rue De Varembe, PO Box 131, CH-1211 Geneva 20, Switzerland, Dec. 7, 2009, pp. 1-23, [retrieved on Dec. 17, 2009].

PCT International Search Report and Written Opinion of International Searching Authority dated Dec. 12, 2017 corresponding to PCT International Application No. PCT/US2017/019884 filed Feb. 28, 2017.

\* cited by examiner

SYSTEM AND METHOD FOR VISUAL TRACEABILITY OF REQUIREMENTS FOR PRODUCTS

TECHNICAL FIELD

The present disclosure is directed, in general, to computer-aided design (CAD), computer-aided manufacturing (CAM), computer-aided engineering (CAE), visualization, simulation, and manufacturing systems, product data management (PDM) systems, product lifecycle management (PLM) systems, and similar systems, that are used to create, use, and manage data for products and other items (collectively referred to herein as product systems).

BACKGROUND

Product systems may be used to manage requirements for products. Such systems may benefit from improvements.

SUMMARY

Variously disclosed embodiments include data processing systems and methods that may be used to facilitate visual traceability of requirements for products. In one example, a system may comprise at least one processor configured to generate a user interface through a display device that outputs a listing of at least a portion of a plurality of requirements for a product based on data stored in a data store that specifies associations between requirements and one or more of a plurality of components included in the product. The at least one processor may also be configured to receive a first input through at least one input device that is representative of a first selection of at least one of the plurality of requirements in the listing. Also, the at least one processor may be configured to: responsive to the first selection determine at least one component that is associated in the data store with the at least one requirement for the product that was selected via the first input; and to cause the user interface to visually indicate in a three dimensional (3D) visualization of a 3D model of the product, which of the plurality of components shown in the 3D visualization of the 3D model of the product are associated with the at least one requirement that was selected via the first input; In addition, the at least one processor may be configured to receive a second input through the at least one input device that is representative of a second selection of a portion of the 3D model corresponding to at least one of the components of the product. Further, the at least one processor may be configured to: responsive to the second selection determine at least one requirement that is associated in the data store with the at least one component of the product that was selected via the second input; and cause the user interface to visually indicate in the listing which of the plurality of requirements is associated with the at least one component of the product that was selected via the second input.

In another example, a method for visual traceability of requirements for products may comprise several acts carried out through operation of at least one processor that correspond to the functions for which the previously described at least one processor is configured to carry out.

A further example may include a non-transitory computer readable medium encoded with executable instructions (such as a software component on a storage device) that when executed, causes at least one processor to carry out this described method.

Another example may include a product or apparatus including at least one hardware, software, and/or firmware based processor, computer, component, controller, means, module, and/or unit configured for carrying out functionality corresponding to this described method.

The foregoing has outlined rather broadly the technical features of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiments disclosed as a basis for modifying or designing other structures for carrying out the same purposes of the present disclosure. Those skilled in the art will also realize that such equivalent constructions do not depart from the spirit and scope of the disclosure in its broadest form.

Also, before undertaking the Detailed Description below, it should be understood that various definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

DETAILED DESCRIPTION

Figure 1:
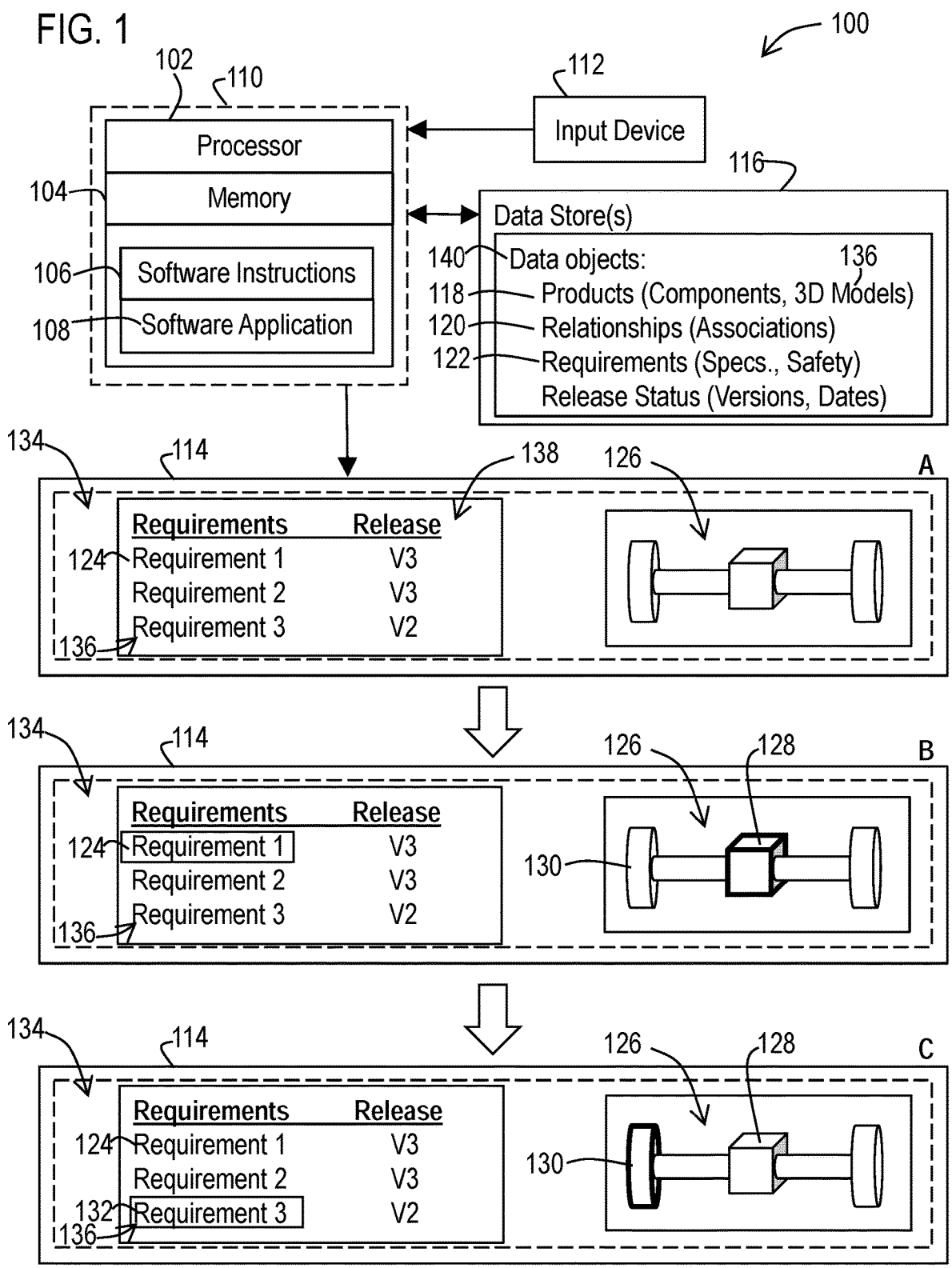
FIG. 1 illustrates a functional block diagram of an example system that facilitates visual traceability of requirements for products.

Various technologies that pertain to systems and methods that facilitate visual traceability of requirements for products will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

With reference to FIG. 1, an example data processing system 100 is illustrated that facilitates carrying out one or more of the embodiments described herein. The system 100 may include at least one processor 102 (e.g., a microprocessor/CPU) that is configured to carry out various processes and functions described herein by executing software instructions 106 corresponding to one or more software applications 108 or portions thereof that are programmed to cause the at least one processor to carry out the various processes and functions described herein. The software instructions may be accessed by the processor from a memory 104. Such a memory 104 may correspond to an internal or external volatile memory (e.g., main memory, CPU cache, and/or RAM), that is included in the processor and/or in operative connection with the processor. Such a memory 104 may also correspond to a nonvolatile memory (e.g., flash memory, SSD, hard drive, or other storage device or non-transitory computer readable media) in operative connection with the processor.

It should be understood that a processor that is described or claimed as being configured to carry out a particular described/claimed process or function may correspond to the combination 110 of the processor 102 with the software instructions 106 loaded/installed into the described memory 104 (volatile and/or non-volatile), which are currently being executed and/or are available to be executed by the processor to cause the processor to carry out the described/claimed process or function. Thus a processor that is powered off or is executing other software, but has the described software instructions installed on a storage device in operative connection therewith (such as a hard drive or SSD) in a manner that is setup to be executed by the processor (when started by a user, hardware and/or other software), may also correspond to the described/claimed processor that is configured to carry out the particular processes and functions described/claimed herein.

Further, it should be understood that a processor that is described or claimed as being configured to carry out a particular described/claimed process or function may correspond to a microprocessor that is hard wired (e.g., an FPGA or ASIC microprocessor) and/or includes firmware programmed to carry out such a described/claimed process or function.

The described data processing system 100 may include at least one input device 112 and at least one display device 114 in operative connection with the processor. The input device, for example, may include a mouse, pointer, touch screen, touch pad, drawing tablet, track ball, buttons, keypad, keyboard, camera, motion sensing device that captures motion gestures, and/or any other type of input device capable of providing the inputs described herein. The display device, for example, may include an LCD display screen, monitor, VR-head seat, and/or a projector. For example, the processor 102, memory 104, software instructions 106, input device 112, and display device 114, may be included as part of a data processing system corresponding to a PC, workstation, server, notebook computer, tablet, mobile phone, or any other type of computing system, or any combination thereof.

The data processing system 100 may also include one or more data stores 116. The processor 102 may be configured to retrieve, generate, use, revise, and store product data and/or other information described herein from/in the data store 116. Examples of a data store may include a database (e.g., ORACLE®, MICROSOFT SQL SERVER®), file system, hard drive, SSD, memory card and/or any other type of device or system that stores non-volatile data.

In example embodiments, the software application 108 may include PLM software applications that may be adapted to carry out the processes and functions described herein. Examples of such PLM software may include the NX suite of applications, Solid Edge software, and/or Teamcenter software, produced by Siemens Product Lifecycle Management Software Inc., of Plano, Tex., US. However, it should be appreciated that the systems and methods described herein may be used in other product systems that manage product that generates, uses, and/or stores product data.

As illustrated in FIG. 1, the at least one processor 102 may be configured (e.g., via the software instructions 106) to access data objects 140 (e.g., data files, data records, or any other type of stored information) from the data store 116 and display portions of the accessed data objects in a user interface 134 displayed through the display device 114. For example, such data objects may correspond to data records including information regarding product data 118 such as parts, components, assemblies, machines, revisions, functions, requirements, Bill of Material (BOM) lines, lifecycle data, 3D models, CAD drawings, test results, system models, metadata, and/or any other information that is associated with products.

The data objects may include or may be associated with data stored in the data store 116 representative of relationships 120 (i.e., associations) between the data objects. Such data object relationships may specify parent-child relationships (one-to-one or one-to-many relationships) as well as recursive relationships. An example of a parent-child relationship may correspond to a data object for an assembly for a product (i.e., the parent component) that is made up a plurality of smaller parts (i.e., child components). Such, child components may further correspond to an assembly comprised of smaller child components. Furthermore, each component may be associated with one or more different revisions (i.e., variations on how the part is constructed).

In addition, the data objects 140 may include data that defines requirements 122 (e.g., for products and/or components thereof). Such requirements may specify aspects that a product or component thereof may be required to have or comply with. Such requirements may correspond to data that defines a functional specification, a safety requirement, a logical requirement, a market requirement, a test plan, a standard, and/or any other information that the product design may need to satisfy/comply therewith. As with data objects for products 118, data objects for requirements 122 may be related to (e.g., may be associated with) other data objects for requirements via parent-child relationships 120. Furthermore, each requirement may be associated with one or more different versions. For example, each requirement may correspond to different data objects that are each associated with one or more different word processing documents (or other documents) that describe therein respective different versions of the respective requirement for a product or component thereof.

These described data objects and associated parent-child relationships therebetween may form a hierarchical arrangement in which parent data objects are at a first level, children data objects are at a second level, grandchildren data objects are at a third level, and other data objects may be at other levels (e.g., higher or lower in the hierarchy). In addition, data objects for requirements and/or versions thereof may be associated with one more data objects for products (e.g., parts, components, assemblies, subassemblies) and revisions to such products.

Data objects and the relationships therebetween may be displayed through the display device 114 via the user interface in the form of textual information such as a listing, tree structure, and/or chart that depicts information for data objects for requirements and data objects for products associated therewith. However, it should also be appreciated that complex products may be represented by many data objects and relationships (e.g., hundreds, thousands, or millions of data objects for a complex machine). Displaying a hierarchical diagram with hundreds or thousands of data objects on a workspace of a user interface (even if scrolling is available) may be difficult for a user to analyze and understand.

In one approach to handle such large amounts of data, trace tables or text based references to related items may be displayed in the user interface. However, trace tables limit the understanding of impacts to a complex system to local individual systems instead of understanding impacts of requirements and changes thereto across many different components/systems of a product.

To enhance the comprehension of such data by a user, the described processor 102 may be configured to generate a user interface 134 through the display device 114 in a form that enables a user to visually research and understand the impact of changes in complex systems with thousands/millions of relationships (aka traceability).

As illustrated in view A of the user interface 134, to enable visualization and better comprehension of such data, an example embodiment may enable a user to select at least one requirement 124 by providing an input through the input device 112 that selects a textual title, name, and/or summary of the requirement shown in the listing 136 (e.g., via a mouse click from a mouse or other pointer input such as via a touchpad or touch screen). In this example, the selected requirement 124 may correspond to a requirement that specifies mechanical features required for a differential gear box (such as gear ratios) or other required specification feature. Also, the text associated with each requirement in the listing 136 may correspond to a name of the requirement that is stored in the data store (e.g., such as the names of files such as a word processing documents that include information defining requirements for the product and/or components of the product).

Subsequently as illustrated in view B of the user interface, in response to the selection of the requirement 124, the processor may determine components of a product that are associated in the data store with the selected requirement. Based on this determination the processor may cause a 3D visualization 126 of a 3D model 136 of the product (or portion thereof) to be displayed in which one or more components 128 (e.g., the differential gear box) associated with the selected requirement 124 are visually highlighted relative to other components 130 (e.g., wheel hubs) of the product (e.g., a drive train) displayed by the 3D model that are not associated with the selected requirement. Also, the selected requirement 124 may be visually highlighted in the listing 136 in response to it being selected in order to visually illustrate that it is currently selected.

It should be understood that a 3D model includes data specifying mathematical representations of a 3D volume/surface of objects such as solid models and shell/boundary models). Such 3D model data 136 may be stored in the data store 116 in a CAD format such as JT or STEP, or other format for storing geometric curves that define the shape of the product and/or components thereof. It should also be understood that a 3D representation or 3D visualization of a 3D model may be carried out via a 2D display screen by illustrating components in a perspective or orthogonal view. Also, it should be appreciated that alternative embodiments may employ 3D display screens and/or a virtual reality headset to enhance the 3D perception of the 3D visual representation of the 3D model.

In example embodiments, visual highlighting a component, for example, may correspond to modifying the visual display of a component in the displayed 3D model to have a different color, light intensity, line style, line thickness, or other visual feature of the displayed component, so as to visually standout from other components of the 3D model. For example, view B depicts a 3D visualization 126 of a 3D model of a drive train of a vehicle, in which a box 128 (e.g., representing a generic differential gear box for example) is shown visually highlighted via thicker/bolder lines compared to the other components 130 (such as wheel hubs) shown with thinner/less bold lines. Similarly, visually highlighting the selected textual requirement 124, may include changing the color, boldness intensity, font of the selected text and/or altering the background around the selected text (such as displaying a bounding box around the text with a different background color compared to other displayed requirements displayed in the user interface 134).

In addition, to further enhance visualization and comprehension of such data objects, this described embodiment may enable a user via the user interface 134 to select at least one component in the displayed 3D visualization 126 of the 3D model, such as one of the components 130 that was not previously visually highlighted and associated with the currently selected requirement 124. Such a selection, for example, may correspond to a user providing a pointer input through an input device such as a mouse, touchpad, or touch screen at a position (e.g., X,Y coordinates) on the display device 114 that intersect with a portion of the 3D visualization of the 3D model that depicts the desired component 130 to be selected. In addition, the user interface may enable a group of components to be selected by dragging a selection selection box around a desired set of components in the 3D visualization of the 3D model of the product.

Subsequently as illustrated in view C of the user interface, in response to the selection of the one or more other components 130 of the 3D model, the processor may determine one or more requirements 132 that are associated (via associations stored in the data store 116) with the selected component 130 in the 3D model, and cause such determined requirements to be displayed in the listing 136. In this example, the visual requirements 132 for the selected 3D component may be visually highlighted so as to stand out from other displayed requirements 124 that are not currently associated with the selected component in the 3D model. In addition, the processor may cause the selected component 130 of the 3D visualization 126 of the 3D model to also be visually highlighted relative to other components shown in the 3D model, which may involve visually un-highlighting any previously highlighted components 128 (where previously highlighted components 128 are no longer associated with the determined requirements for a selected component). Similarly, the processor may also visually un-highlight any textual requirements 124, which are no longer associated with the selected 3D component 130.

This described user interface enables a user to explore requirements via interaction with the 3D visualization of the 3D model of the product. Thus, a user may search for and select different desired requirements in order to display corresponding 3D models including one or more highlighted components associated with such requirements as well as select different components in a displayed 3D model in order to determine and display one or more requirements associated with the selected component.

In example embodiments, the previously described data store 116 may include different versions of each of the various types of requirements 122 that have been associated with a product and the components of the product over time. This data in the data store may, for example, include release status (such as version numbers) and corresponding dates (such as a release date) associated with each version of the requirements. The previously described listing 136 of requirements may further include text that displays release status information such as the version numbers 138 associated with the requirement shown in the listing.

Figure 2:
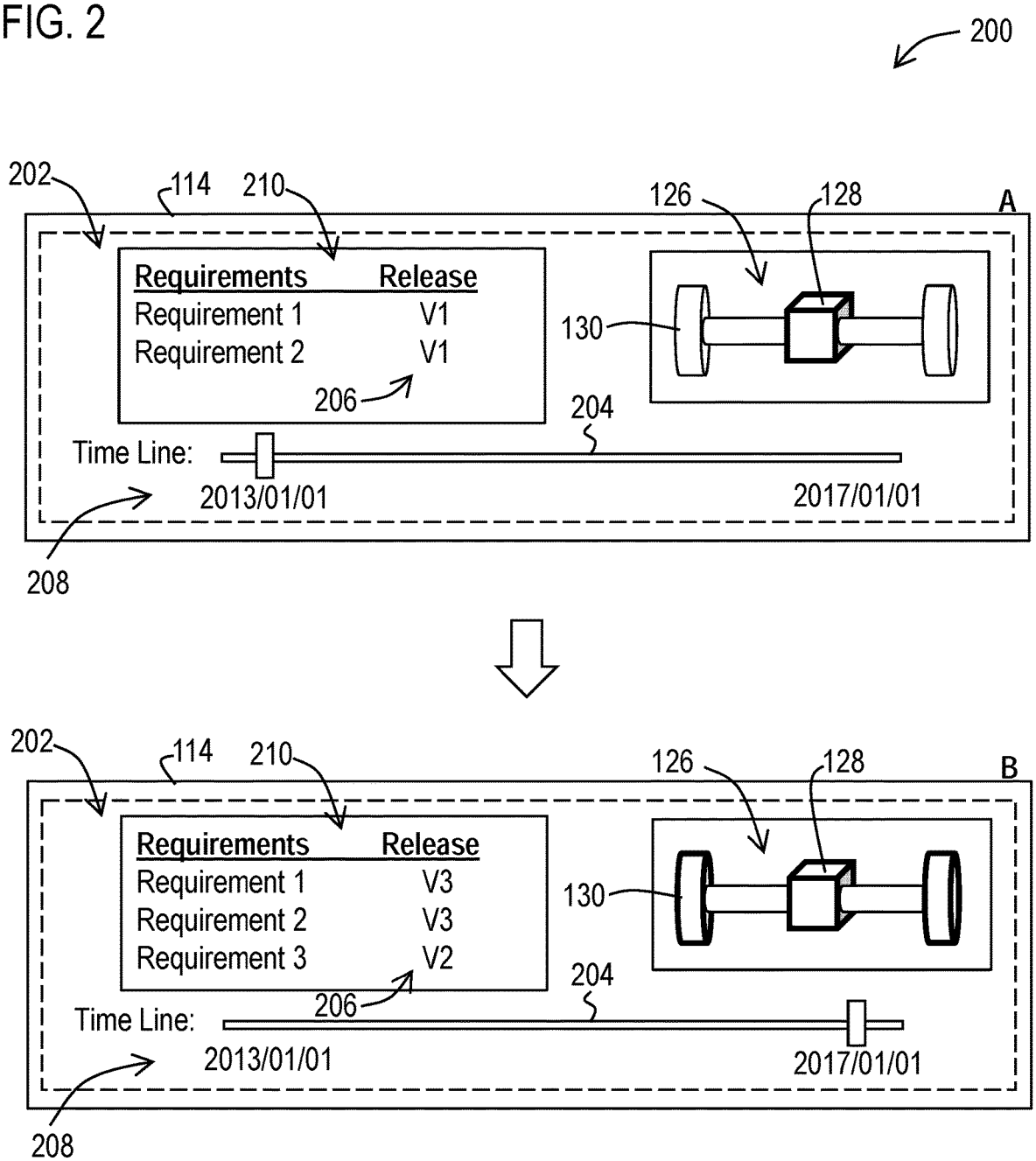
FIGS. 2-3 illustrate further examples of user interfaces that facilitate visual traceability of requirements for products.

With reference now to FIG. 2, a further example embodiment 200 of a user interface 202 is depicted that may enable a user to visualize changes to requirements over time based on such version data that is stored in the data store. In this example, the user interface 202 includes an additional user interface control 204 that is configured to enable a user to display different versions 206 of requirements for a product. Such a user interface may correspond to a slider bar, buttons, a selection list, or other control(s), with which a user may select different dates along a time line 208 of different dates. For example, in view A of the user interface 202, a slider bar control 204 may be manipulated to display the latest versions of requirements that were associated with the product on an earlier selected date such as "2013 Jan. 1". View B of the user interface 202 illustrates the slider bar 204 after being manipulated (e.g., slid) to display versions of the requirements on a later date such as "2017 Jan. 1".

In this described embodiment, the processor may also be configured to determine and visually highlight in the 3D model of the product, which requirements, which versions of the requirements, and which components that correspond to the versions of requirements being highlighted for the current position of the slider bar 204. For example, in view A in FIG. 2, the listing of requirements 210 shows release status versions numbers 206 that are associated with a relatively smaller set of components 128 for the selected earlier date, whereas in view B the listing 210 shows newer release status version numbers 206 and additional requirements associated with a relatively larger set of components 128, 130 for the later selected date.

It should also be appreciated that the user interfaces 134, 202 shown in FIGS. 1 and 2 correspond to general outlines of a user interface in order to illustrate the features being described. Implementations of such user interfaces may include additional features that display additional information, menus, tabs, and/or buttons that enable the users to research and/or update requirements associated with products stored in the data store.

Figure 3:
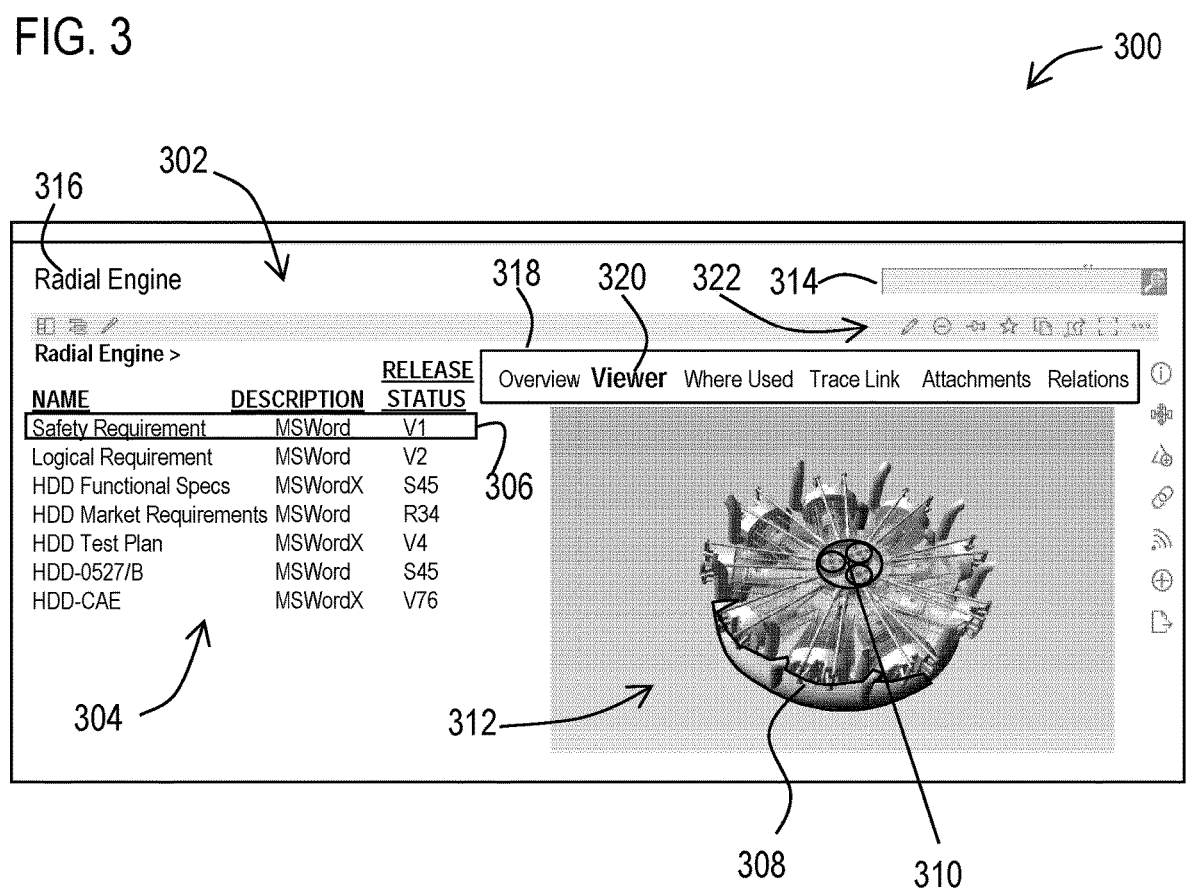

For example, FIG. 3 shows a further example embodiment 300 of such a user interface 302. In this example, the user interface includes a listing of requirements 304 in which individual requirements are selectable. As discussed previously, selection of a textual requirement 306 causes the user interface to visually highlight 3D components 308, 310 in a 3D visualization of a 3D model 312 of the product that are associated in the data store with the selected requirement 306. Also, as described previously, directly selecting a 3D component in the 3D visualization of the 3D model of the product causes the textual requirements 306 to be modified to visually highlight requirements associated with the selected 3D component.

In addition, the user interface may include a search box 314 in which a user may enter a textual search for requirements associated with a product, or portion thereof. The user interface may also include textual information 316 that describes the currently selected product (e.g., a "Radial Engine") for which requirements and 3D models are displayed. In addition, such a user interface may include a user interface control (such as a tab bar) 318 that enables different sub-windows or tabs to be displayed that depict different types of information associated with requirements. For example, to display the example 3D model 312, a "Viewer" tab 320 of the tab bar is shown selected. Other tabs may display information from the data store associated the selected requirements such as: an overview showing metadata (e.g., status, version, creation dates, authors) of requirements; a textual listing of components where the requirement is used; trace links between requirements; a listing of attachments (e.g., documents, models, images) associated with requirements; and/or a listing of relations for requirements. In addition, the user interface may include buttons 322 that activate functions carried out through operation of the processor for editing and manipulating requirements and/or information stored in the data store about requirements.

The resulting visual traceability provided by the example user interfaces 134, 202, 302, converts relationships to a graphical presentation allowing users to see in a 3D visualization of a product, which components are impacted by requirements that are being changed or updated. The impact of a requirement change is shown via the 3D visualization to help users to quickly assess the global impact of a change by highlighting graphically what areas of the product are related to the selection and vice versa (i.e., cross-probing between: requirements to product; and product to requirements). For example, a user may use the described user interface to quickly understand that a change to a single requirement directed to a subassembly (e.g., a component of an engine), may have a large impact on the overall product assembly (e.g., other components of the engine). The 3D view provided by the described user interface may then be used to navigate to additional detail without overwhelming the user with too much information.

Figure 4:
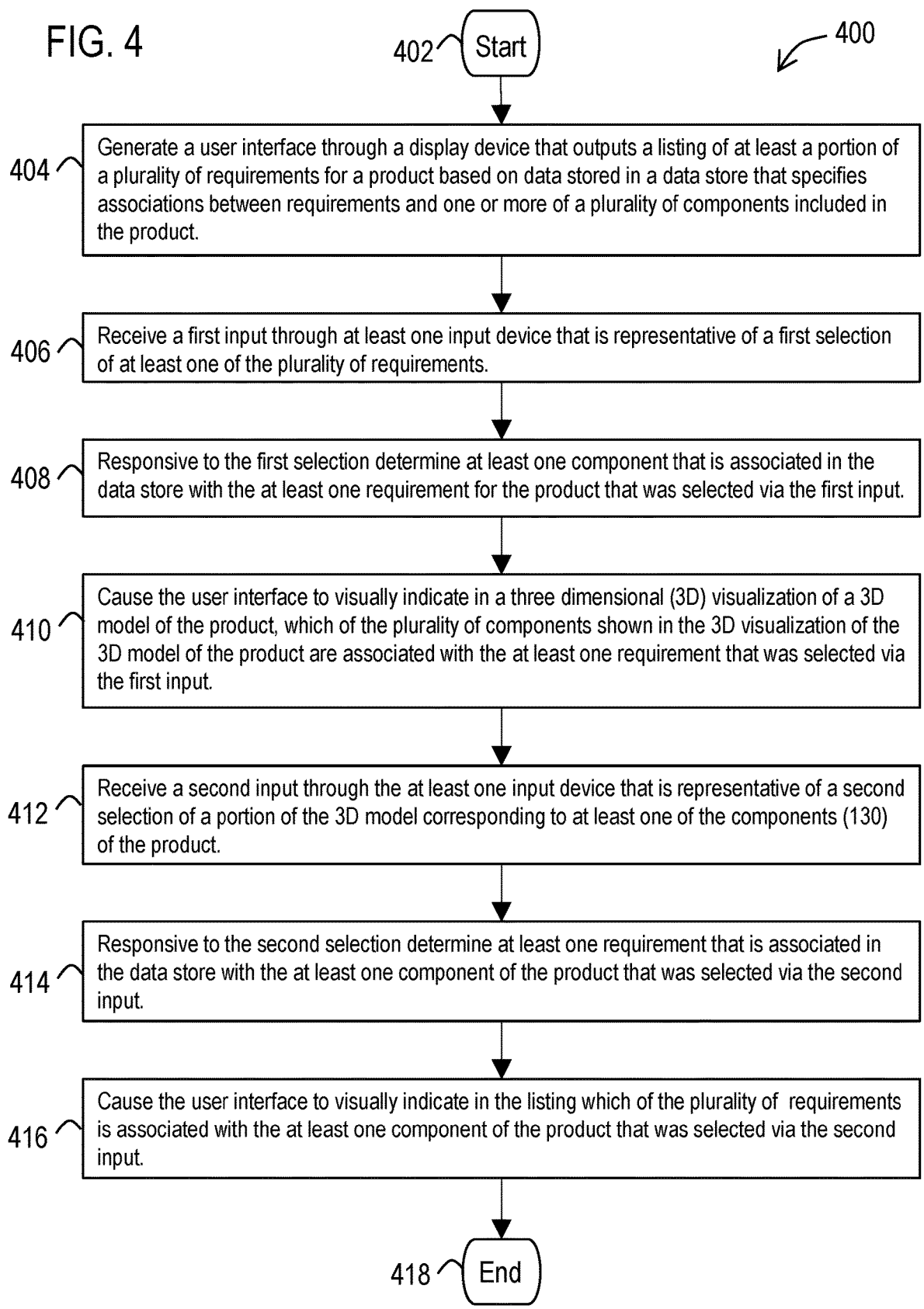
FIG. 4 illustrates a flow diagram of an example methodology that facilitates visual traceability of requirements for products.

With reference now to FIG. 4, various example methodologies are illustrated and described. While the methodologies are described as being a series of acts that are performed in a sequence, it is to be understood that the methodologies may not be limited by the order of the sequence. For instance, some acts may occur in a different order than what is described herein. In addition, an act may occur concurrently with another act. Furthermore, in some instances, not all acts may be required to implement a methodology described herein.

It is important to note that while the disclosure includes a description in the context of a fully functional system and/or a series of acts, those skilled in the art will appreciate that at least portions of the mechanism of the present disclosure and/or described acts are capable of being distributed in the form of computer-executable instructions contained within non-transitory machine-usable, computer-usable, or computer-readable medium in any of a variety of forms, and that the present disclosure applies equally regardless of the particular type of instruction or data bearing medium or storage medium utilized to actually carry out the distribution. Examples of non-transitory machine usable/readable or computer usable/readable mediums include: ROMs, EPROMs, magnetic tape, hard disk drives, SSDs, flash memory, CDs, DVDs, and BLU-RAY® disks. The computer-executable instructions may include a routine, a sub-routine, programs, applications, modules, libraries, and/or the like. Still further, results of acts of the methodologies may be stored in a computer-readable medium, displayed on a display device, and/or the like.

Referring now to FIG. 4, a methodology 400 is illustrated that facilitates visual traceability of requirements for products. The methodology may start at 402 and may include several acts carried out through operation of at least one processor. These acts may include an act 404 of generating a user interface through a display device that outputs a listing of at least a portion of a plurality of requirements for a product based on data stored in a data store that specifies associations between requirements and one or more of a plurality of components included in the product. Also, these acts may include an act 406 of receiving a first input through at least one input device that is representative of a first selection of at least one of the plurality of requirements in the listing. Responsive to the first selection, the methodology may include an act 408 of determining at least one component that is associated in the data store with the at least one requirement for the product that was selected via the first input; and may include an act 410 of causing 410 the user interface to visually indicate in a three dimensional (3D) visualization 126 of a 3D model 136 of the product, which of the plurality of components shown in the 3D visualization of the 3D model of the product are associated with the at least one requirement that was selected via the first input. In addition, the acts may include an act 412 of receiving a second input through the at least one input device that is representative of a second selection of a portion of the 3D model corresponding to at least one of the components of the product. Responsive to the second selection the methodology may include an act 414 of determining at least one requirement that is associated in the data store with the at least one component of the product that was selected via the second input; and may include an act 416 of causing the user interface to visually indicate in the listing which of the plurality of requirements is associated with the at least one component of the product that was selected via the second input. At 418 the methodology may end.

Also, it should be appreciated that this described methodology may include additional acts and/or alternative acts corresponding to the features described previously with respect to the data processing system 100.

For example, at least one of the requirements in the listing may display a name of a word processing document stored in the data store for the at least one requirement that includes information defining requirements for the product and/or at least one component of the product. In addition, the methodology may be carried with the at least one input device including a pointer device and the second input including a pointer input at a point on the display screen that intersects with the portion of the 3D visualization of the 3D model.

In further examples, the data stored in the data store may include more than one version of at least some of the plurality of requirements and the listing may displays text that provides information about which versions of the requirements are displayed in the listing.

In another example embodiment, the act 404 of generating the user interface may include causing the user interface to include a user interface control that is usable by a user to cause the user interface to display which requirements and which versions of the requirements were associated with the product at different dates in time. As discussed previously, such a user interface control may include a slider bar that enables different points in time to be selected, which different points are associated with different versions of requirements.

This described example of the methodology may include: an act of receiving a third input through at least one input device that is representative of a third selection using the user interface control of at least one of a plurality of versions of at least one requirement; and act of causing the user interface to visually indicate in the listing (210) which of the plurality of requirements and which version thereof was selected via the third input. In addition, this described example may include responsive to the third selection an act of determining at least one component that is associated in the data store with the at least one version of the at least one requirement for the product that was selected via the third input; and an act of causing the user interface to visually indicate in the 3D visualization (126) of the 3D model of the product, which of the plurality of components (128) shown in the 3D visualization of the 3D model of the product are associated with the at least one version of the at least one requirement that was selected via the third input.

As discussed previously, acts associated with these methodologies (other than any described manual acts) may be carried out by one or more processors. Such processor(s) may be included in one or more data processing systems, for example, that execute software components (including software instructions) operative to cause these acts to be carried out by the one or more processors. In an example embodiment, such software components may comprise computer-executable instructions corresponding to a routine, a sub-routine, programs, applications, modules, libraries, a thread of execution, and/or the like. Further, it should be appreciated that software components may be written in and/or produced by software code/environments/languages/compilers/frameworks such as with respect to machine code, assembly language, JAVA®, JAVASCRIPT®, PYTHON®, C, C#, C++ or any other software tool capable of producing software components and user interfaces configured to carry out the acts and features described herein.

Figure 5:
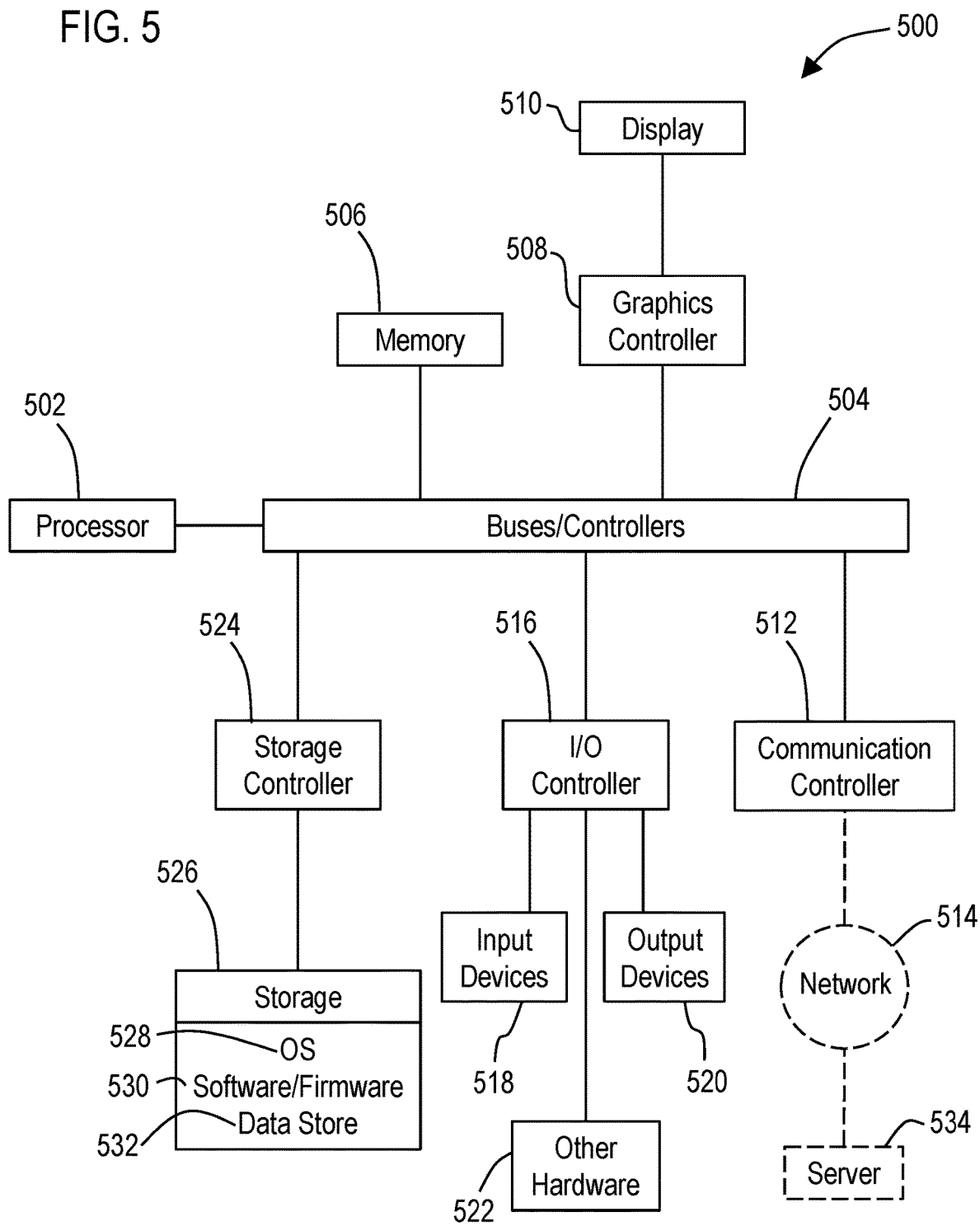
FIG. 5 illustrates a block diagram of a data processing system in which an embodiment may be implemented.

FIG. 5 illustrates a block diagram of a data processing system 500 (e.g., a computer system) in which an embodiment can be implemented, for example, as a portion of a product system, and/or other system operatively configured by software or otherwise to perform the functions and processes as described herein. The data processing system depicted includes at least one processor 502 (e.g., a CPU) that may be connected to one or more bridges/controllers/buses 504 (e.g., a north bridge, a south bridge). One of the buses 504, for example, may include one or more I/O buses such as a PCI Express bus. Also connected to various buses in the depicted example may include a main memory 506 (RAM) and a graphics controller 508. The graphics controller 508 may be connected to one or more display devices 510 (e.g., LCD display screen, monitor, VR headset, and/or projector). It should also be noted that the processor 502 may include a CPU cache memory. Further, in some embodiments one or more controllers (e.g., graphics, south bridge) may be integrated with the CPU (on the same chip or die). Examples of CPU architectures include IA-32, x86-64, and ARM processor architectures.

Other peripherals connected to one or more buses may include communication controllers 512 (Ethernet controllers, WiFi controllers, cellular controllers) operative to connect to a local area network (LAN), Wide Area Network (WAN), a cellular network, and/or other wired or wireless networks 514 or communication equipment.

Further components connected to various busses may include one or more I/O controllers 516 such as USB controllers, BLUETOOTH® controllers, and/or dedicated audio controllers (connected to speakers and/or microphones). It should also be appreciated that various peripherals may be connected to the I/O controller(s) (via various ports and connections) including input devices 518 (e.g., keyboard, mouse, pointer, touch screen, touch pad, drawing tablet, trackball, buttons, keypad, game controller, gamepad, camera, microphone, scanners, motion sensing devices that capture motion gestures), output devices 520 (e.g., printers, speakers) or any other type of device that is operative to provide inputs to or receive outputs from the data processing system.

Also, it should be appreciated that many devices referred to as input devices or output devices may both provide inputs and receive outputs of communications with the data processing system. For example, the processor 502 may be integrated into a housing (such as a tablet) that includes a touch screen that serves as both an input and display device. Further, it should be appreciated that some input devices (such as a laptop) may include a plurality of different types of input devices (e.g., touch screen, touch pad, and keyboard). Also, it should be appreciated that other peripheral hardware 522 connected to the I/O controllers 516 may include any type of device, machine, or component that is configured to communicate with a data processing system.

Additional components connected to various busses may include one or more storage controllers 524 (e.g., SATA). A storage controller may be connected to a storage device 526 such as one or more storage drives and/or any associated removable media, which can be any suitable non-transitory machine usable or machine readable storage medium. Examples, include nonvolatile devices, volatile devices, read only devices, writable devices, ROMs, EPROMs, magnetic tape storage, floppy disk drives, hard disk drives, solid-state drives (SSDs), flash memory, optical disk drives (CDs, DVDs, BLU-RAY®, and other known optical, electrical, or magnetic storage devices drives and/or computer media. Also in some examples, a storage device such as an SSD may be connected directly to an I/O bus 504 such as a PCI Express bus.

A data processing system in accordance with an embodiment of the present disclosure may include an operating system 528, software/firmware 530, and data stores 532 (that may be stored on a storage device 526 and/or the memory 506). Such an operating system may employ a command line interface (CLI) shell and/or a graphical user interface (GUI) shell. The GUI shell permits multiple display windows to be presented in the graphical user interface simultaneously, with each display window providing an interface to a different application or to a different instance of the same application. A cursor or pointer in the graphical user interface may be manipulated by a user through a pointing device such as a mouse or touch screen. The position of the cursor/pointer may be changed and/or an event, such as clicking a mouse button or touching a touch screen, may be generated to actuate a desired response. Examples of operating systems that may be used in a data processing system may include MICROSOFT WINDOWS®, LINUX®, UNIX®, IOS®, and ANDROID® operating systems. Also, examples of data stores include data files, data tables, relational database (e.g., Oracle, Microsoft SQL Server), database servers, or any other structure and/or device that is capable of storing data, which is retrievable by a processor.

The communication controllers 512 may be connected to the network 514 (which may or may not be a part of a data processing system 500), which can be any local, wide area, remote, private, and/or public data processing system network or combination of networks, as known to those of skill in the art, including the Internet. Data processing system 500 can communicate over the network 514 with one or more other data processing systems such as a server 534 (which may in combination correspond to a larger data processing system). For example, a larger data processing system may correspond to a plurality of smaller data processing systems implemented as part of a distributed system in which processors associated with several smaller data processing systems may be in communication by way of one or more network connections and may collectively perform tasks described as being performed by a single larger data processing system. Thus, it is to be understood that when referring to a data processing system, such a system may be implemented across several data processing systems organized in a distributed system in communication with each other via a network.

It should also be understood that the term "controller" means any device, system or part thereof that controls at least one operation, whether such a device is implemented in hardware, firmware, software or any combination thereof. It should be noted that the functionality associated with any particular controller may be centralized or distributed, whether locally or remotely. The described processor and memory may be included in a controller. Further, a controller may correspond to the described data processing system or any other hardware circuit that is operative to control at least one operation.

In addition, it should be appreciated that data processing systems may include virtual machines in a virtual machine architecture or cloud environment. For example, the processor 502 and associated components may correspond to the combination of one or more virtual machine processors of a virtual machine operating in one or more physical processors of a physical data processing system. Examples of virtual machine architectures include VMWARE ESXI™, MICROSOFT HYPER-V°, XEN® and KVM.

Those of ordinary skill in the art will appreciate that the hardware depicted for the data processing system may vary for particular implementations. For example, the data processing system 500 in this example may correspond to a controller, computer, workstation, server, PC, notebook computer, tablet, mobile phone, and/or any other type of apparatus/system that is operative to process data and carry out functionality and features described herein associated with the operation of a data processing system, computer, processor, software components, and/or a controller discussed herein. The depicted example is provided for the purpose of explanation only and is not meant to imply architectural limitations with respect to the present disclosure.

Also, it should be noted that the processor described herein may correspond to a remote processor located in a data processing system such as a server that is remote from the display and input devices described herein. In such an example, the described display device and input device may be included in a client data processing system (which may have its own processor) that communicates with the server (which includes the remote processor) through a wired or wireless network (which may include the Internet). In some embodiments, such a client data processing system, for example, may execute a remote desktop application or may correspond to a portal device that carries out a remote desktop protocol with the server in order to send inputs from an input device to the server and receive visual information from the server to display through a display device. Examples of such remote desktop protocols include TERADICI PCOIP®, MICROSOFT® RDP, and the RFB protocol. In another example, such a client data processing system may execute a web browser or thin client application. Inputs from the user may be transmitted from the web browser or thin client application to be evaluated on the server, rendered by the server, and an image (or series of images) sent back to the client data processing system to be displayed by the web browser or thin client application. Also in some examples, the remote processor described herein may correspond to a combination of a virtual processor of a virtual machine executing in a physical processor of the server.

Also, as used herein a processor corresponds to any electronic device that is configured via hardware circuits, software, and/or firmware to process data. For example, processors described herein may correspond to one or more (or a combination) of a microprocessor, CPU, FPGA, ASIC, or any other integrated circuit (IC) or other type of circuit that is capable of processing data in a data processing system, which may have the form of a controller board, computer, server, mobile phone, and/or any other type of electronic device. Further the phrase "at least one" before an element (e.g., a processor) that is configured to carry out more than one function/process may correspond to one or more elements (e.g., processors) that each carry out the functions/processes and may also correspond to two or more of the elements (e.g., processors) that respectively carry out different ones of the one or more different functions/processes.

As used herein, the terms "component" and "system" are intended to encompass hardware, software, or a combination of hardware and software. Thus, for example, a system or component may be a process, a process executing on a processor, or a processor. Additionally, a component or system may be localized on a single device or distributed across several devices.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of the data processing system 500 may conform to any of the various current implementations and practices known in the art.

Also, it should be understood that the words or phrases used herein should be construed broadly, unless expressly limited in some examples. For example, the terms "include" and "comprise," as well as derivatives thereof, mean inclusion without limitation. The singular forms "a", "an" and "the" are intended to include the plural forms as well, unless the context clearly indicates otherwise. Further, the term "and/or" as used herein refers to and encompasses any and all possible combinations of one or more of the associated listed items. The term "or" is inclusive, meaning and/or, unless the context clearly indicates otherwise. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Also, although the terms "first", "second", "third" and so forth may be used herein to refer to various elements, information, functions, or acts, these elements, information, functions, or acts should not be limited by these terms. Rather these numeral adjectives are used to distinguish different elements, information, functions or acts from each other. For example, a first element, information, function, or act could be termed a second element, information, function, or act, and, similarly, a second element, information, function, or act could be termed a first element, information, function, or act, without departing from the scope of the present disclosure.

In addition, the term "adjacent to" may mean: that an element is relatively near to but not in contact with a further element; or that the element is in contact with the further portion, unless the context clearly indicates otherwise.

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, act, or function is an essential element, which must be included in the claim scope: the scope of patented subject matter is defined only by the allowed claims. Moreover, none of these claims are intended to invoke a means plus function claim construction unless the exact words "means for" are followed by a participle.

What is claimed is:

1. A system for visual traceability of requirements for products comprising:
    at least one processor configured to:
        generate a user interface through a display device that outputs a listing of at least a portion of a plurality of requirements for a product based on data stored in a data store that specifies associations between requirements and one or more of a plurality of components included in the product;
        receive a first input through at least one input device that is representative of a first selection of at least one of the plurality of requirements in the listing;
        responsive to the first selection determine at least one component that is associated in the data store with the at least one requirement for the product that was selected via the first input;
        cause the user interface to visually indicate in a three dimensional (3D) visualization of a 3D model of the product, which of the plurality of components shown in the 3D visualization of the 3D model of the product are associated with the at least one requirement that was selected via the first input;
        receive a second input through the at least one input device that is representative of a second selection of a portion of the 3D model corresponding to at least one of the components of the product;
        responsive to the second selection determine at least one requirement that is associated in the data store with the at least one component of the product that was selected via the second input; and
        cause the user interface to visually indicate in the listing which of the plurality of requirements is associated with the at least one component of the product that was selected via the second input.

2. The system according to claim 1, wherein at least one of the requirements in the listing displays a name of a word processing document stored in the data store for the at least one requirement that includes information defining requirements for the product or at least one component of the product.

3. The system according to claim 1, wherein the at least one input device includes a pointer device, wherein the second input includes a pointer input at a point on the display device that intersects with the portion of the 3D visualization of the 3D model.

4. The system according to claim 1, wherein the data stored in the data store includes more than one version of at least some of the plurality of requirements, wherein the listing displays text that provides information about which versions of the requirements are displayed in the listing.

5. The system according to claim 1, wherein the at least one processor is configured to cause the user interface to include a user interface control that is usable by a user to cause the user interface to display which requirements and which versions of the requirements were associated with the product at different dates in time.

6. The system according to claim 5, wherein the at least one processor is configured to:
   receive a third input through at least one input device that is representative of a third selection using the user interface control of at least one of a plurality of versions of at least one requirement;
   cause the user interface to visually indicate in the listing which of the plurality of requirements and which version thereof was selected via the third input;
   responsive to the third selection determine at least one component that is associated in the data store with the at least one version of the at least one requirement for the product that was selected via the third input; and
   cause the user interface to visually indicate in the 3D visualization of the 3D model of the product, which of the plurality of components shown in the 3D visualization of the 3D model of the product are associated with the at least one version of the at least one requirement that was selected via the third input.

7. The system according to claim 5, wherein the user interface control includes a slider bar that enables different points in time to be selected, which different points are associated with different versions of requirements.

8. A method for visual traceability of requirements for products comprising:
   through operation of at least one processor:
      generating a user interface through a display device that outputs a listing of at least a portion of a plurality of requirements for a product based on data stored in a data store that specifies associations between requirements and one or more of a plurality of components included in the product;
      receiving a first input through at least one input device that is representative of a first selection of at least one of the plurality of requirements in the listing;
      responsive to the first selection determining at least one component that is associated in the data store with the at least one requirement for the product that was selected via the first input;
      causing the user interface to visually indicate in a three dimensional (3D) visualization of a 3D model of the product, which of the plurality of components shown in the 3D visualization of the 3D model of the product are associated with the at least one requirement that was selected via the first input;
      receiving a second input through the at least one input device that is representative of a second selection of a portion of the 3D model corresponding to at least one of the components of the product;
      responsive to the second selection determining at least one requirement that is associated in the data store with the at least one component of the product that was selected via the second input; and
      causing the user interface to visually indicate in the listing which of the plurality of requirements is associated with the at least one component of the product that was selected via the second input.

9. The method according to claim 8, wherein at least one of the requirements in the listing displays a name of a word processing document stored in the data store for the at least one requirement that includes information defining requirements for the product or at least one component of the product.

10. The method according to claim 8, wherein the at least one input device includes a pointer device, wherein the second input includes a pointer input at a point on the display device that intersects with the portion of the 3D visualization of the 3D model.

11. The method according to claim 8, wherein the data stored in the data store includes more than one version of at least some of the plurality of requirements, wherein the listing displays text that provides information about which versions of the requirements are displayed in the listing.

12. The method according to claim 8, wherein generating the user interface includes causing the user interface to include a user interface control that is usable by a user to cause the user interface to display which requirements and which versions of the requirements were associated with the product at different dates in time.

13. The method according to claim 12, wherein through operation of the at least one processor:
   receiving a third input through at least one input device that is representative of a third selection using the user interface control of at least one of a plurality of versions of at least one requirement;
   causing the user interface to visually indicate in the listing which of the plurality of requirements and which version thereof was selected via the third input;
   responsive to the third selection determining at least one component that is associated in the data store with the at least one version of the at least one requirement for the product that was selected via the third input; and
   causing the user interface to visually indicate in the 3D visualization of the 3D model of the product, which of the plurality of components shown in the 3D visualization of the 3D model of the product are associated with the at least one version of the at least one requirement that was selected via the third input.

14. The method according to claim 12, wherein the user interface control includes a slider bar that enables different points in time to be selected, which different points are associated with different versions of requirements.

15. A non-transitory computer readable medium encoded with executable instructions that when executed, cause at least one processor to:
   generate a user interface through a display device that outputs a listing of at least a portion of a plurality of requirements for a product based on data stored in a data store that specifies associations between requirements and one or more of a plurality of components included in the product;
   receive a first input through at least one input device that is representative of a first selection of at least one of the plurality of requirements in the listing;
   responsive to the first selection determine at least one component that is associated in the data store with the at least one requirement for the product that was selected via the first input;
   cause the user interface to visually indicate in a three dimensional (3D) visualization of a 3D model of the product, which of the plurality of components shown in the 3D visualization of the 3D model of the product are associated with the at least one requirement that was selected via the first input;
   receive a second input through the at least one input device that is representative of a second selection of a portion of the 3D model corresponding to at least one of the components of the product;

responsive to the second selection determine at least one requirement that is associated in the data store with the at least one component of the product that was selected via the second input; and cause the user interface to visually indicate in the listing which of the plurality of requirements is associated with the at least one component of the product that was selected via the second input.

16. The non-transitory computer readable medium according to claim 15, wherein at least one of the requirements in the listing displays a name of a word processing document stored in the data store for the at least one requirement that includes information defining requirements for the product or at least one component of the product.

17. The non-transitory computer readable medium according to claim 15, wherein the at least one input device includes a pointer device, wherein the second input includes a pointer input at a point on the display device that intersects with the portion of the 3D visualization of the 3D model.

18. The non-transitory computer readable medium according to claim 15, wherein the data stored in the data store includes more than one version of at least some of the plurality of requirements, wherein the listing displays text that provides information about which versions of the requirements are displayed in the listing.

19. The non-transitory computer readable medium according to claim 15, wherein the executable instructions, when executed, cause the at least one processor to cause the user interface to include a user interface control that is usable by a user to cause the user interface to display which requirements and which versions of the requirements were associated with the product at different dates in time.

20. The non-transitory computer readable medium according to claim 19, wherein the executable instructions, when executed, cause the at least one processor to:

receive a third input through at least one input device that is representative of a third selection using the user interface control of at least one of a plurality of versions of at least one requirement;

cause the user interface to visually indicate in the listing which of the plurality of requirements and which version thereof was selected via the third input;

responsive to the third selection determine at least one component that is associated in the data store with the at least one version of the at least one requirement for the product that was selected via the third input; and cause the user interface to visually indicate in the 3D visualization of the 3D model of the product, which of the plurality of components shown in the 3D visualization of the 3D model of the product are associated with the at least one version of the at least one requirement that was selected via the third input.

* * * * *